United States Patent
Schroeck

(10) Patent No.: US 11,021,808 B2
(45) Date of Patent: Jun. 1, 2021

(54) METHOD AND APPARATUS FOR PULLING A SINGLE CRYSTAL BY THE FZ METHOD

(71) Applicant: SILTRONIC AG, Munich (DE)

(72) Inventor: Thomas Schroeck, Kastl (DE)

(73) Assignee: SILTRONIC AG, Munich (DE)

(*) Notice: Subject to any disclaimer, the term of this patent is extended or adjusted under 35 U.S.C. 154(b) by 61 days.

(21) Appl. No.: 16/474,875

(22) PCT Filed: Feb. 13, 2018

(86) PCT No.: PCT/EP2018/053479
§ 371 (c)(1),
(2) Date: Jun. 28, 2019

(87) PCT Pub. No.: WO2018/149797
PCT Pub. Date: Aug. 23, 2018

(65) Prior Publication Data
US 2019/0352795 A1   Nov. 21, 2019

(30) Foreign Application Priority Data
Feb. 15, 2017   (DE) .......................... 102017202413.5

(51) Int. Cl.
*C30B 13/24* (2006.01)
*C30B 13/30* (2006.01)
(Continued)

(52) U.S. Cl.
CPC ............... *C30B 13/30* (2013.01); *C30B 13/24* (2013.01); *C30B 13/32* (2013.01); *C30B 29/06* (2013.01)

(58) Field of Classification Search
CPC ......... C30B 13/16; C30B 13/24; C30B 13/28; C30B 13/32
See application file for complete search history.

(56) References Cited

U.S. PATENT DOCUMENTS 5,108,720 A * 4/1992 Bourbina ................ C30B 11/10
117/12
5,688,321 A * 11/1997 Kimura .................. C30B 13/26
117/200

(Continued)

FOREIGN PATENT DOCUMENTS

CN   101680108 A    3/2010
CN   103436951      12/2013
(Continued)

*Primary Examiner* — Robert M Kunemund
(74) *Attorney, Agent, or Firm* — Brooks Kushman P.C.

(57) ABSTRACT

FZ single crystals are pulled by melting a polycrystal with electromagnetic melting apparatus and then recrystallizing. First, a lower end of the polycrystal is melted; second, a monocrystalline seed is attached to the lower end of the polycrystal and melted beginning from an upper end thereof; third, between a lower section of the seed and the polycrystal, a thin neck is formed whose diameter ($d_D$) is smaller than that ($d_I$) of the seed; and fourth, between the thin neck section and the polycrystal, a conical section is formed. Before the conical growth, a switchover position (h') of the polycrystal, the position at which the rate of polycrystal movement relative to the melting apparatus is to be reduced is determined, and the rate is reduced, in amount when the switchover position (h') is reached.

9 Claims, 6 Drawing Sheets

(51) Int. Cl.
*C30B 13/32* (2006.01)
*C30B 29/06* (2006.01)

(56) References Cited

U.S. PATENT DOCUMENTS

2006/0174820 A1*  8/2006  Yoshizawa .............. C30B 13/00
                                                      117/13
2010/0107968 A1    5/2010  Vaabengaard et al.

FOREIGN PATENT DOCUMENTS

| | | | |
|---|---|---|---|
| CN | 105297131 | A | 2/2016 |
| DE | 102010040464 | A1 | 3/2012 |
| JP | H0977588 | A | 3/1997 |
| JP | 11189486 | A | 7/1999 |
| JP | 2000-44380 | A | 2/2000 |
| JP | 2000044380 | * | 2/2000 |
| JP | 4016363 | B2 | 9/2007 |
| JP | 2010-076979 | A | 4/2010 |
| JP | 2010076979 | * | 4/2010 |
| JP | 2011-37640 | A | 2/2011 |
| JP | 2016-023099 | A | 2/2016 |
| JP | 2016084250 | A | 5/2016 |
| WO | 2014033212 | A1 | 3/2014 |

* cited by examiner

METHOD AND APPARATUS FOR PULLING A SINGLE CRYSTAL BY THE FZ METHOD

CROSS REFERENCE TO RELATED APPLICATIONS

This application is the U.S. National Phase of PCT Appln. No. PCT/EP2018/053479 filed Feb. 13, 2018, which claims priority to German Application No. 10 2017 202 413.5 filed Feb. 15, 2017, the disclosures of which are incorporated in their entirety by reference herein.

BACKGROUND OF THE INVENTION

1. Field of the Invention

The present invention relates to a method for pulling a single crystal by the FZ method, in which a polycrystal is melted by means of an electromagnetic melting apparatus and then recrystallized, and also to a corresponding plant.

2. Description of the Related Art

In the pulling of single crystals, particularly those of semiconductor material, by the FZ method, the so-called floating zone method or zone melting method, it is possible to generate single crystals of high purity. In this method, a polycrystal, in other words more particularly a crystal made of polycrystalline semiconductor material, is melted and then recrystallized.

In such a method, there are different phases that can be distinguished, as they are described in WO 2014/033212 A1, for example. The polycrystal in this case is first of all melted and then recrystallized on a monocrystalline seed.

In the beginning of the process, diameter of the monocrystal to be fabricated is reduced from approximately the diameter of the seed, in what is called a thin neck section, and is subsequently widened to a desired diameter in a conical section. The diameter can then be kept constant in order to give, for example, a monocrystal in rod form.

Known from JP 4 016 363 B2, for example, is an FZ method wherein four different cameras are used to record different regions of the polycrystal, of the seed attached thereto, and of the liquid or molten material located between them. From these recordings, determinations are then made not only of diameters of the polycrystal and of the monocrystal, but also of a height of the region or the zone of the liquid or molten material, referred to as the zone height.

In a method of this kind, it is possible to determine a distance between a lower edge at the outer margin of the polycrystal, and a lower phase boundary between liquid material and solid material on the part of the seed. Based on these determinations, there are various regulating operations that can be performed.

In a phase in which the conical section of the polycrystal is to be melted, the need is generally for an (occasionally drastic) reduction in the rate at which the polycrystal is moved relative to the melting apparatus. In this way it is possible to melt the necessary amount of material. Using a distance, as mentioned above, it is not possible, however, or is difficult, to determine a position of the polycrystal at which the reduction in rate is to take place.

Against this background, therefore, the object is that of providing an easier and/or more precise means of adjusting a position of the polycrystal at which its rate is to be reduced, in order thus in particular to allow the operation to be automated.

SUMMARY OF THE INVENTION

Proposed in accordance with the invention are a method and a plant for pulling a single crystal, wherein prior to growth of the conical section, a switchover position is determined, and the rate of lowering is reduced is changed when the switchover position is reached.

The starting point for the invention is a method for pulling a single crystal by the FZ method, in which a polycrystal is melted by means of an electromagnetic melting apparatus and then recrystallized. Material eligible for the polycrystal and hence also for the monocrystal to be fabricated here is, in particular, a semiconductor material, preferably silicon. It will be understood that the material may also include certain impurities or dopants.

DETAILED DESCRIPTION OF THE PREFERRED EMBODIMENTS

Figure 1A:
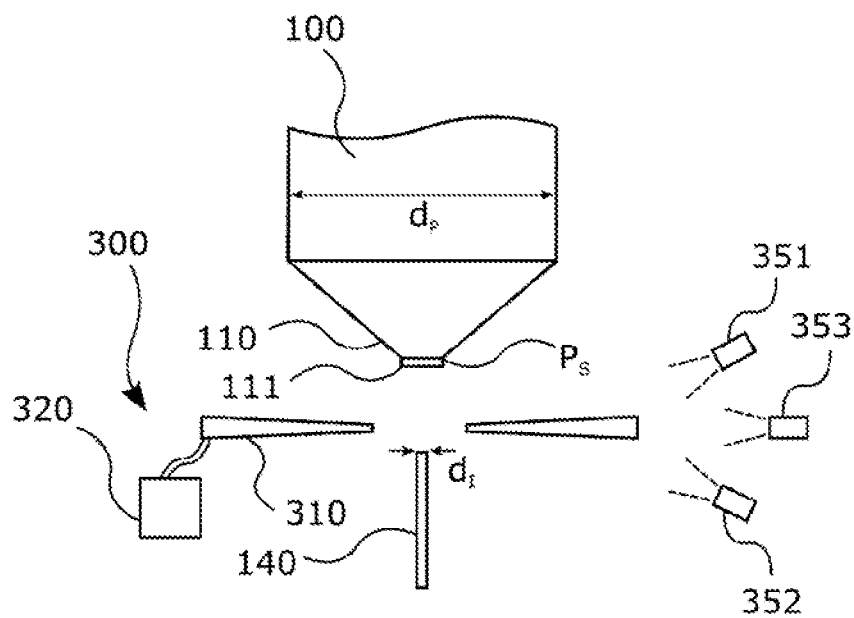
FIG. 1a shows, schematically, a polycrystal and a melting apparatus with which a method of the invention can be implemented.

In a first phase, the polycrystal, which as a general rule is in the form of a rod having a diameter of 160 mm, for example, is first melted by means of a melting apparatus, beginning at a lower (in relation to gravity in the case of vertical disposition of the rod-shaped polycrystal) end. The melting apparatus contemplated here is, in particular, an inductor or an induction coil. In this case, by means of radiofrequency excitation, electromagnetic energy can be coupled into the polycrystal, which is brought into the vicinity of the inductor.

In the aforementioned first phase, the polycrystal, which as a general rule is conical at its lower end, optionally with a shallow lower section, can be lowered and brought to a central hole in the inductor. In order to maximize the amount of electromagnetic energy coupled into the polycrystal, it is useful to bring the lower end of the polycrystal to the edge of the hole. The polycrystal then begins to melt at the lower end, with the formation initially of a drop of liquid material hanging from the polycrystal.

Then, in a second phase, a monocrystalline seed, which in particular is likewise rod-shaped and has a diameter of around 4 to 7 mm, for example, is attached to the lower end of the polycrystal and hence to the drop of liquid material, and is then melted, beginning from an upper end of the seed. The melting of the seed generally begins only after the temperature of the seed has adjusted itself to that of the material that is already liquid. The seed may usefully be melted over a certain region of its length, a length which may be, for example, between 5 and 20 mm. It will be understood, however, that a certain region at its lower end is not melted, since this region is required for fixing in a pulling apparatus. For the melting of the seed, the seed and the polycrystal are moved upward. This means, for example, that the seed is moved in the direction of the hole in the inductor. In this procedure, a preliminary seed is formed at the lower end of the polycrystal. A preliminary seed in this context is a region, more particularly in the form of a plug, at the lower end of the polycrystal, on which the seed is then attached.

In a third phase, then, between a lower section of the seed (at which the seed may be held, for example, in the aforementioned pulling apparatus) and the polycrystal (that is, the portion of the polycrystal which is still solid and has not yet melted), a thin neck section is formed whose diameter is smaller than that of the seed. This thin neck section is formed in order to remove any dislocations which form, for example, as a result of the attaching of the seed to the liquid material on the polycrystal. The diameter of the thin neck section here may amount, for example, to between 2 and 4 mm. In order to form this thin neck section, the seed and the polycrystal, after the seed has been melted as desired, can be moved downward again. By now increasing the rate of lowering of the seed, there is a decrease in the diameter of the zone of liquid material, or of the material which then crystallizes, owing to the conservation of mass.

After the thin neck section, the diameter of the monocrystal can then be increased to a desired diameter of, for example, around 200 mm and then retained.

For this purpose, in a fourth phase in the FZ method, a conical section may now be formed between the thin neck section and the polycrystal. A conical section of this kind serves to widen the diameter from that of the thin neck section to a desired diameter. For this purpose it is necessary as a general rule to alter a rate of lowering of the seed (together with the material already crystallized thereon) and of the polycrystal, in order to increase the diameter. In particular, a reduction in the rate of lowering means that more material is able to crystallize, thereby increasing the diameter. In particular, in this fourth phase, the polycrystal may be moved or lowered initially at a moderate rate, then at an increased rate, and subsequently at a very low rate. Such different rates are necessary in order to overcome as quickly as possible any phase in which the phase boundary is not present uniformly. In particular, the reduction in the rate (to the aforementioned very low rate) serves to allow sufficient material of the polycrystal to be melted continuously, since this is also necessary for the increasing diameter of the conical section. A reduction may take place, for example, from a rate of 0.5 mm/min or more, more particularly between 0.5 and 1 mm/min, to a rate of less than 0.5 mm/min, more particularly between 0.1 and 0.5 mm/min. Before and after the reduction in the rate, however, the polycrystal may in particular be moved in accordance with a target curve for the rate.

In accordance with the invention, before the fourth phase is reached, a switchover position of the polycrystal is determined, being the position at which a rate at which the polycrystal is moved relative to the melting apparatus is to be reduced in amount. Then, in the fourth phase, the rate at which the polycrystal is moved relative to the melting apparatus is reduced correspondingly in amount when the switchover position is reached.

Customarily, a so-called plug is formed at the lower end of the polycrystal. In the case of a new polycrystal, this plug generally has a planar face. However, if the polycrystal used has already been melted, in an FZ method, for example, which—for whatever reasons—had to be terminated, then the plug (which in that case, in particular in the terminated method, was formed as a preliminary seed) no longer has a defined shape. In particular, this shape may also be dependent on the melting apparatus used in the case of the terminated FZ method. Accordingly, the shape of the plug and/or its position of the base on the conical section may vary from polycrystal to polycrystal. Correspondingly, the switchover position as well may vary from polycrystal to polycrystal.

Since, therefore, the corresponding switchover position is determined at an early phase of the FZ method, more particularly as early as in the first phase, it is very easily possible to reduce the rate in the fourth phase, in other words, in particular, when the switchover is needed. This therefore makes it possible to control the rate at which the polycrystal is moved. Regulation is unnecessary. In particular, therefore, automation of the method is made significantly easier.

It is preferred here if, for the purpose of determining the switchover position, a measurement is made of a distance of a location which is characteristic of the polycrystal, this location being situated on the lower end of a conical section of the polycrystal, relative to a fixed reference point, as for example a defined location on the melting apparatus, with the switchover position then being determined from the distance. This characteristic location may in particular be a location at which an angle of inclination of the conical section of the polycrystal changes by more than a predetermined value. This therefore includes, in particular, the so-called plug on the lower end of the polycrystal. Such a location may be recognized, for example, on the basis of a characteristic or predetermined diameter of the polycrystal. The distance here is therefore not known beforehand and is measured first by suitable means, as part of an image processing procedure, for example.

In relation to this distance it is possible, particularly synchronously, to determine an intermediate position of the polycrystal, more particularly relative to that of the melting apparatus, on the basis, for example, of a current position of a lowering or pulling apparatus. The intermediate position may therefore be a readily measurable or outputable position of the polycrystal (particularly in the vertical direction). Using a desired distance of the characteristic location from the melting apparatus, at which the rate is to be reduced, hence in particular a near-ideal distance at which precisely the correct amount of material is melted if the rate there is reduced accordingly, it is therefore possible—by addition or subtraction (depending on situation) of a suitable value, for example—to determine the switchover position from the previously determined intermediate position of the polycrystal, then likewise, for example, as a defined position of the lowering or pulling apparatus. It is therefore possible by this means to determine a previously unknown position of the characteristic location in relation to the entire polycrystal, and the reduction in rate can be accomplished very simply during the fourth phase.

Alternatively, it is preferred, for the purpose of determining the switchover position, to determine an intermediate position of the polycrystal at which the location which is characteristic of the polycrystal, and which is situated at the lower end of a conical section of the polycrystal, reaches or exceeds a predetermined distance from a fixed reference point during movement of the polycrystal, with the switchover position being determined from the intermediate position. Here again, the characteristic location may be recognized in particular from a characteristic or predetermined diameter of the polycrystal. If then, for example, during raising or lowering of the polycrystal, the diameter at the predetermined distance is captured accordingly, continuously or repeatedly, the intermediate position of the polycrystal, especially relative to the melting apparatus, may then likewise be determined as a defined location of the lowering or pulling apparatus, for example when the characteristic location reaches or exceeds the predetermined distance. This may be recognized, for example, by the diameter at the height of the predetermined distance undershooting or exceeding a defined value. By adding the corresponding distance, in other words, here, the aforementioned predetermined distance from the fixed reference point, corrected to include the desired distance of the location from the fixed reference point, at the time at which the rate is to be reduced, it is therefore possible very easily to determine the switchover position.

With both variants, therefore, the intermediate position can be determined, and can be used to determine the switchover position. Whereas in the case of the first variant, the distance of the characteristic location from the reference point (for example, at a suitable point in time) can easily be measured, in the case of the second variant the distance from the reference point is predetermined, so to speak, and this distance is then monitored until the characteristic location reaches or passes this distance during movement of the polycrystal. Depending on circumstances, one variant or the other may be more simple and/or more advantageous.

The location which is characteristic of the polycrystal is preferably captured using a camera, which in particular is disposed above the melting apparatus. This allows the distance to be determined or captured particularly easily. For example, by means of a camera, it is possible to recognize light/dark differences or light/dark transitions very readily, hence also allowing a change in the angle of inclination—as a result of which there is a change in reflection at the crystal—to be captured effectively.

Advantageously, the switchover position is determined in the first phase and/or in the second phase, in other words, for example, also during a transition from the first to the second phase. The switchover position can be determined particularly well here, since a good view of the aforementioned location for determining the diameter is possible by means of a camera, for example.

A further subject of the invention is a plant which is equipped for implementing the method of the invention. For this purpose the plant may comprise in particular a melting apparatus, of the kind already mentioned previously, for example, and also a suitable arithmetic unit. The arithmetic unit may then be equipped accordingly to implement the individual method steps and also, for example, to drive the cameras accordingly and to evaluate their images.

In order to avoid repetition, reference may otherwise be made to the above elucidations concerning the method of the invention, with regard to further embodiments and also to the advantages of the plant.

Further advantages and embodiments of the invention will be apparent from the description and the appended drawing.

It will be appreciated that the features identified above and those still to be elucidated hereinafter can be used not only in the particular combination indicated but also in other combinations, or on their own, without departing from the scope of the present invention.

The invention is illustrated schematically in the drawing by an exemplary embodiment, and is described below with reference to the drawing.

Illustrated schematically in a side view in FIG. 1a are a polycrystal 100 and a melting apparatus 300 with which a method of the invention can be implemented. The melting apparatus 300 here has an inductor or induction coil 310, which can be driven or operated correspondingly with radiofrequency, for example, by means of a drive unit 320 which is connected via corresponding lines.

This melting apparatus 300 may be part of a plant which is equipped for the pulling of a single crystal. A plant of this kind may then also have corresponding holding devices for the inductor 300, the single crystal 100, and the cameras 351, 352 and 353. Moreover, a plant of this kind may have an arithmetic unit (not shown) for controlling the other constituents.

The polycrystal 100, which in particular may comprise or consist of silicon, is predominantly rod-shaped or cylindrical. In the rod-shaped or cylindrical region, of which only part is shown here, the polycrystal 100 has a diameter $d_P$ which may be, for example, 160 mm. At its lower end, however, the polycrystal 100 is conical in shape, thus having a conical section 110. It can be seen, furthermore, that the conical section 110 may in turn have what is called a plug 111, in this case with a flat end, at its lower end.

Also visible is a seed 140 having diameter $d_I$ which may be, for example, 4 to 7 mm. The seed comprises a monocrystal, which may likewise be rod-shaped or cylindrical in form.

Figure 1B:
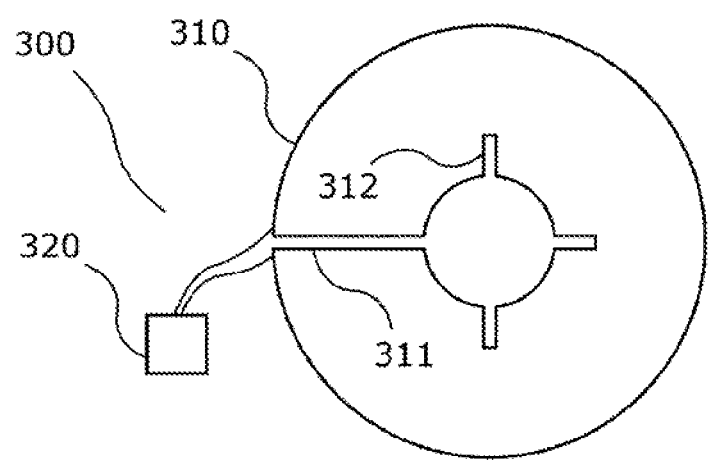
FIG. 1b shows the melting apparatus from FIG. 1 in a different view.

In FIG. 1b, the melting apparatus 300 from FIG. 1a is shown in a different view, in the present case a plan view, albeit without the polycrystal 100. Clearly visible here, then, is a recess or a hole in the middle of the inductor 310, through which the polycrystal is guided—during the melting operation and then in the liquefied state.

Visible in particular here, then, is a primary slot 311 and also three ancillary slots 312, advantageous for the function of the melting apparatus, more particularly for generation of the electromagnetic energy. As can be seen, the inductor is not closed, because of the primary slot 311.

Figure 2:
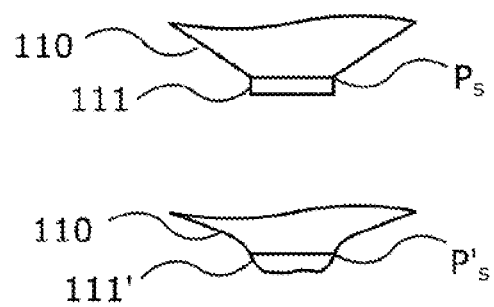
FIG. 2 shows various shapes of the lower end of a polycrystal.

Shown again in FIG. 2 (top) is the lower end of the polycrystal 100 from FIG. 1a with the conical section 110 and the plug 111. Shown additionally (bottom) for comparison is a lower end or conical section of a polycrystal which has not been machined but which instead originates, for example, from an—uncompleted—melting operation. In this instance, as can be seen, the conical section and the plug 111' are somewhat different in shape.

This different shape comes about as a result of the melting and solidifying again. In this case, in particular, the base $P_S$ of the plug may have undergone shifting to a location characteristic of the polycrystal. However, a defined distance of precisely this location or base $P_S$ from the melting apparatus 300 ought to be maintained if the rate of the polycrystal is reduced, in order to maximize the quality of the transition to the conical section that is to be shaped.

FIGS. 3a to 3g then show, schematically, different phases of a method of the invention in one preferred embodiment. The process of the method will be elucidated in more detail below with reference to FIGS. 3a to 3g and also to FIG. 4, which shows the rates $v_P$ of the polycrystal and $v_I$ of the seed in the individual phases over the time t.

In a first phase $P_1$, the polycrystal 100 is first brought up to the inductor 310 or the recess in its center. For this purpose, for example, the polycrystal is lowered at a constant rate. The seed 140 here need not as yet be moved. Contrary to the orientation shown here, the polycrystal 100 may also be brought closer to an inner margin of the inductor 310, in order to allow more effective coupling of the electromagnetic energy into the polycrystal 100.

Figure 3A:
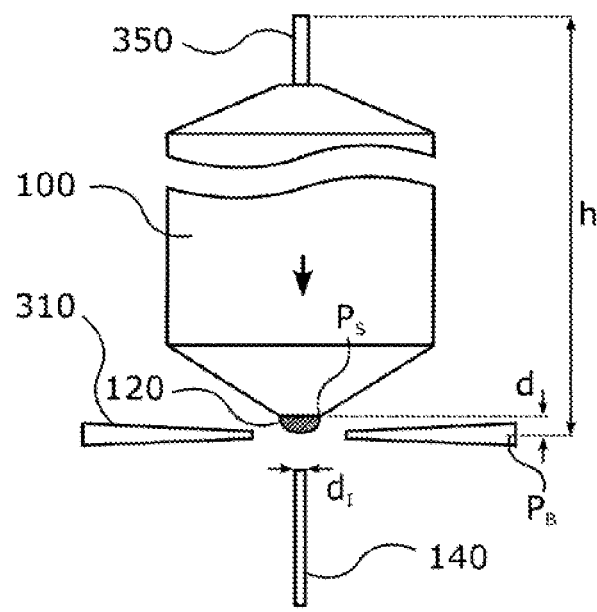
FIG. 3a to 3g show, schematically, various phases of a method of the invention in one preferred embodiment.
Figure 4:
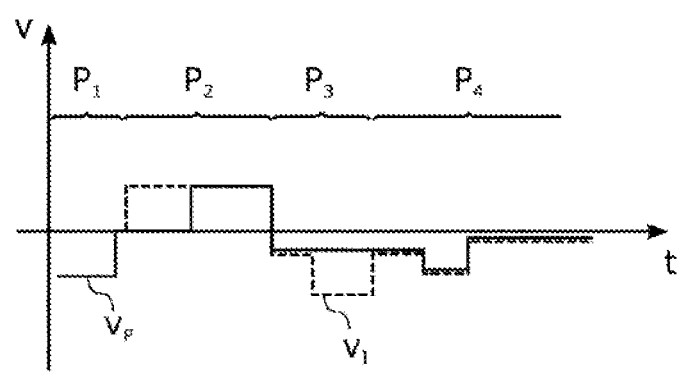
FIG. 4 shows a temporal sequence of a method of the invention in one preferred embodiment.

The polycrystal 100 thus begins to melt at its lower end, hence including the lower end of the conical section. In this case, a drop 120 of liquid material which hangs from the polycrystal is formed, as can be seen in FIG. 3a. Here and in the following figures, liquid material is shown with hatching, whereas solid material is shown in white or without hatching.

In this first phase $P_1$, it is then possible to determine a switchover position of the polycrystal 100, being the position at which a rate at which the polycrystal 100 is moved relative to the melting apparatus 300 is to be reduced. With regard to the switchover position, reference may be made at this point to FIG. 3e as well.

In this regard, in the example shown, a distance d is measured of a location $P_S$, which is characteristic of the polycrystal, at the lower end of the conical section of the polycrystal 100, in the present instance the base of the (partially melted) plug, and hence of the drop 120, relative to a fixed reference point $P_B$, which corresponds here, by way of example, to a defined location on the inductor 310. This can be done using one of the cameras that are shown in FIG. 1a, more particularly the camera 351 or 353. The location $P_S$ can be recognized in particular from its characteristic diameter.

Furthermore, an intermediate position of the polycrystal 100 relative to that of the melting apparatus 300 is determined. In the example shown, this intermediate position corresponds to the distance h of a defined location of a lowering or drawing apparatus 350, by means of which the polycrystal 100 can be moved, from the fixed reference point $P_B$. It will be appreciated that a distance h of this kind may also be determined relative to any desired alternative reference point. It may be noted in particular that as a general rule, a current position of the polycrystal (relative to the fixedly installed lowering or drawing apparatus) can be output by the lowering or drawing apparatus 350 itself.

From this intermediate position or this distance h, the switchover position h' can then be determined, being the position at which the location $P_S$, for example, then has a defined distance d' from the fixed reference point $P_B$. As can be seen from the FIG. 3a, a switchover position of this kind can be determined very easily from the position or the distance h.

Instead of measuring the distance d, it is also possible—as already mentioned earlier—to stipulate the distance d beforehand and then to monitor this stipulated distance until the location $P_S$ reaches or passes this distance. It will be appreciated that it is only for the sake of ease of comprehension that in the figure the two distances, i.e., the distance determined relative to the location, and the distance predetermined and monitored, are identical.

Figure 3B:
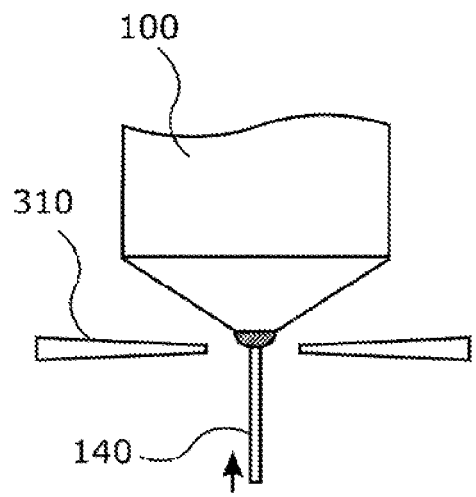

In a second phase $P_2$, the seed 140 is then attached to the lower end of the polycrystal 100 and hence to the drop 120 of liquid material, as can be seen in FIG. 3b, and is melted beginning from an upper end of the seed 140. For this purpose, the seed is first of all moved toward the polycrystal 100, in other words upward, at a defined rate, for example, while the polycrystal 100 may be at rest. The melting of the seed 140 in this case generally begins only after the temperature of the seed 140 has equalized with that of the already liquid material.

Figure 3C:
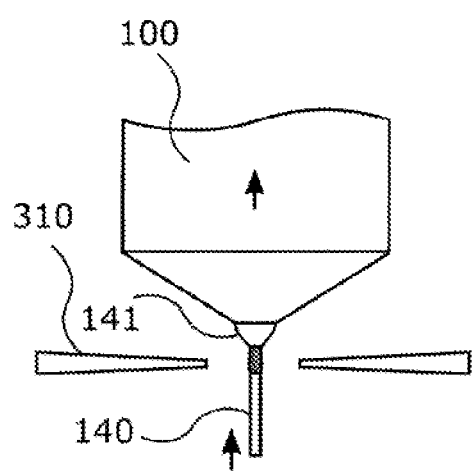

When the seed 140 is attached to the drop of liquid material at the lower end of the polycrystal 100 and has melted together with it, the polycrystal 100 and the seed 140 are jointly moved upward, as can be seen in FIG. 3c. In this case the preliminary seed 141 is also formed at the lower end of the polycrystal 100. The seed may then be melted over a certain region of its length, between 5 and 20 mm, for example, by the seed being moved in the direction of the hole in the inductor 310.

It will be understood, however, that a certain region at the lower end of the seed 140 will not be melted, since this section is needed for fastening in a pulling apparatus (as part of the aforementioned plant).

In a third phase $P_3$, then, between a lower section of the seed 140 and the polycrystal 100 (that is, the portion of the polycrystal that is still solid and has not yet melted), a thin neck section is formed whose diameter do, at 2 to 4 mm, for example, is smaller than that of the seed 140. For this purpose, the polycrystal 100 and the seed 140 are first of all moved downward simultaneously, i.e., at the same rate.

Figure 3D:
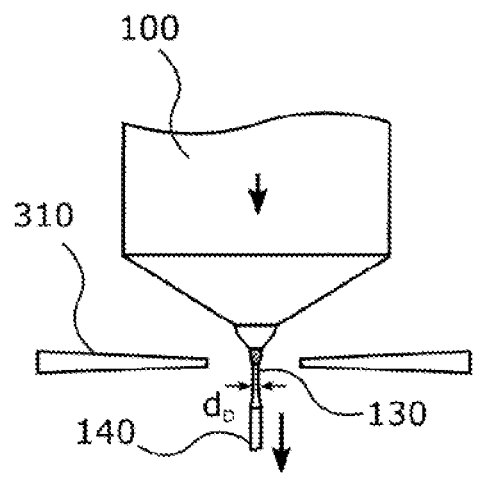

The lowering rate of the seed 140 is then increased at a certain time point relative to that of the polycrystal 100. Therefore, the diameter of the zone of liquid material or of the material which then crystallizes is reduced, owing to the conservation of mass. In FIG. 3d, for example, a thin neck section having a certain length is already formed.

Figure 3E:
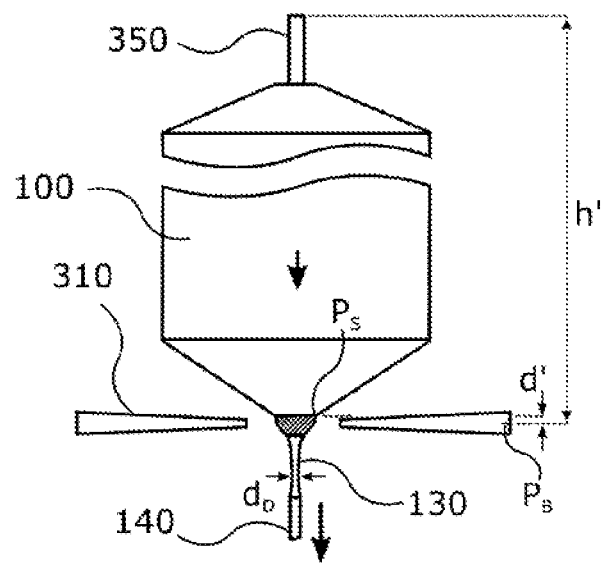
Figure 3F:
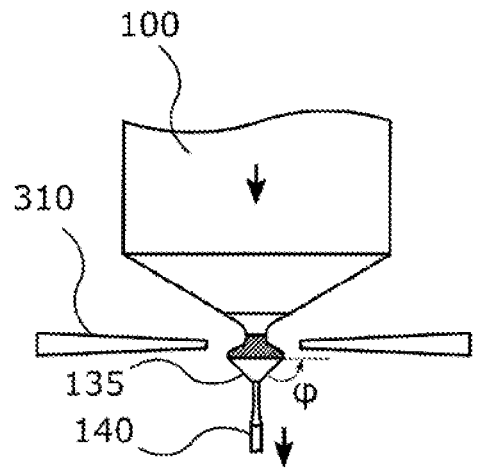
Figure 3G:
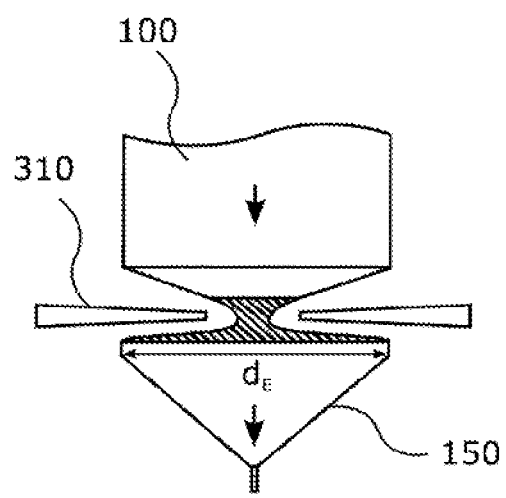

In a fourth phase $P_4$, it is then possible, between the thin neck section and the polycrystal 100, for a conical section 135 to be formed, as can be seen in FIGS. 3e and 3f. A conical section 135 of this kind serves to widen the diameter from that of the thin neck section to a desired diameter $d_E$ of, for example, 200 mm of the monocrystal 150 to be fabricated, as can be seen in FIG. 3g. The conical section here has an angle φ of inclination.

Formation of the conical section 135, i.e. at the start of the increase in diameter, requires a reduction in amount of the rate at which the polycrystal 100 is moved, or lowered, relative to the melting apparatus 300, in order to be able to melt the corresponding amount of material. This is apparent in FIG. 4 from the last rate change shown in phase $P_4$.

Whereas the phase boundary between liquid and solid material is located here in a region with a large diameter and extends extensively over the diameter, the phase boundary beforehand is located only in a relatively thin region of the preliminary seed. Consequently, a relatively high rate is desired initially, in order to advance the transition rapidly, whereas later on a relatively low rate is desirable so as not to melt an excessive quantity of material, something which, in view of the extensive phase boundary, would be accompanied by difficulties with regard to the near-ideal shaping of the cone.

This reduction in rate takes place at a point in time at which the polycrystal 100 is located at the previously determined switchover position h'. In FIG. 3e, this switchover position is represented with a distance h' relative to the fixed reference point $P_S$, similarly to the case with the position or distance h in FIG. 3a. When this distance h' is reached, therefore, the characteristic location $P_S$ has a desired distance d' from the reference point $P_B$. This distance d' defines a near-ideal distance at which, with the maximum possible accuracy, the desired amount of material of the polycrystal 100 is melted, on the predetermined reduction in the rate, so as to form the desired conical section 135. A reduction in rate of this kind can be very easily automated, since there is no need for regulation.

The invention claimed is:

1. A method for pulling a single crystal by the FZ method, in which a polycrystal having a conical section at its lower end is melted by means of an electromagnetic melting apparatus and then recrystallized, comprising:
   a) in a first phase ($P_1$) melting a lower end of the polycrystal by means of the melting apparatus;
   b) in a second phase ($P_2$) attaching a monocrystalline seed to the lower end of the polycrystal and melting the monocrystalline seed beginning from an upper end of the seed;

c) in a third phase ($P_3$) forming a thin neck section between a lower section of the seed and the polycrystal, the diameter ($d_D$) of the thin neck section being smaller than that ($d_I$) of the seed; and d) in a fourth phase ($P_4$) forming a conical section of the single crystal between the thin neck section and the polycrystal, and e) before the fourth phase ($P_4$) is reached, determining a switchover position (h') of the polycrystal, the switchover position being a position, at which a rate with which the polycrystal is moved relative to the melting apparatus is to be reduced in amount, the switchover position (h') determined by either e)i) measuring a distance (d) of a location ($P_S$) characteristic of the polycrystal and situated at the lower end of a conical section of the polycrystal relative to a fixed reference point ($P_B$), the switchover position (h') determined from the distance (d), or e)ii) determining an intermediate position (h) of the polycrystal, at which a location ($P_S$) characteristic of the polycrystal and situated at the lower end of a conical section of the polycrystal reaches or exceeds a predetermined distance (d) relative to a fixed reference point ($P_B$) during movement of the polycrystal, the switchover position (h') determined from the intermediate position (h); and f) in the fourth phase ($P_4$) reducing the rate at which the polycrystal is moved relative to the melting apparatus, when the switchover position (h') is reached.

2. The method of claim 1, further comprising determining an intermediate position (h) of said polycrystal in addition to the distance (d) and determining the switchover position (h') from the intermediate position (h) by using the distance (d).

3. The method of claim 1, further comprising capturing the location ($P_S$) characteristic of the polycrystal on the basis of a characteristic diameter or predefined diameter of the polycrystal.

4. The method of claim 2, further comprising capturing the location ($P_S$) characteristic of the polycrystal on the basis of a characteristic diameter or predefined diameter of the polycrystal.

5. The method of claim 1, wherein the location ($P_S$) characteristic of the polycrystal at the lower end of the conical section of the polycrystal comprises a location at which an angle of inclination of the conical section of the polycrystal changes by more than a predefined value.

6. The method of claim 1, further comprising capturing the location ($P_S$) characteristic of the polycrystal by using a camera, which is disposed above the melting apparatus.

7. The method of claim 1, further comprising determining the switchover position (h') in the first phase ($P_1$) and/or in the second phase ($P_2$).

8. The method of claim 1, wherein the rate at which the polycrystal is moved relative to the melting apparatus is 0.5 mm/min or more before the reduction of the rate, and is less than 0.5 mm/min after the reduction of the rate.

9. The method of claim 1, further comprising moving the polycrystal in accordance with a target curve for the rate at which the polycrystal is moved relative to the melting apparatus, before and after the reduction in the rate.

\* \* \* \* \*